United States Patent
Zhang et al.

(10) Patent No.: US 10,420,265 B2
(45) Date of Patent: Sep. 17, 2019

(54) AUTOMATED INSERTING DEVICE FOR WORKPIECE ASSEMBLY

(71) Applicant: NANNING FUGUI PRECESION INDUSTRIAL CO., LTD., Nanning (CN)

(72) Inventors: Jian-De Zhang, Shenzhen (CN); Chih-Wei Yang, New Taipei (TW); Bai-Tong Fu, Shenzhen (CN); Tsai-Sheng Lan, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 464 days.

(21) Appl. No.: 15/205,193

(22) Filed: Jul. 8, 2016

(65) Prior Publication Data

US 2017/0347505 A1    Nov. 30, 2017

(30) Foreign Application Priority Data

May 28, 2016    (CN) .......................... 2016 1 0367089

(51) Int. Cl.
*H05K 13/04* (2006.01)
*B23P 21/00* (2006.01)

(52) U.S. Cl.
CPC ........ *H05K 13/0404* (2013.01); *B23P 21/004* (2013.01); *H05K 13/04* (2013.01)

(58) Field of Classification Search
CPC .......................... H05K 13/04; H05K 13/0404
See application file for complete search history.

(56) References Cited

FOREIGN PATENT DOCUMENTS

| CN | 103331589 A | 10/2013 |
|---|---|---|
| CN | 203599801 U | 5/2014 |
| CN | 203690681 U | 7/2014 |
| CN | 104191431 A | 12/2014 |
| CN | 105196273 A | 12/2015 |
| CN | 205032906 U | 2/2016 |
| CN | 105499961 A | 4/2016 |
| CN | 205240765 U | 5/2016 |
| KR | 10-1288207 B1 | 6/2008 |

*Primary Examiner* — Livius R. Cazan
(74) *Attorney, Agent, or Firm* — ScienBiziP, P.C.

(57) ABSTRACT

An inserting device includes a feeding mechanism, a positioning mechanism, and an assembling mechanism. The feeding mechanism includes a first supporting plate, a second supporting plate, a lifting assembly and a single-axis sliding table. The second supporting plate includes a first place position and an adjacent second place position. The second supporting plate and the first supporting plate can form a receiving space. The lifting assembly lifts trays located on the first place position and the second place position. The single-axis sliding table is received in the receiving space. The single-axis sliding table includes a sliding block. The sliding block receives the tray dropped from the first placing position and further carries the tray away from the first placing position. The positioning mechanism includes a clamping jaw. The clamping jaw clamps a workpiece from the tray and positions the workpiece again. The assembling mechanism assemblies the workpiece on a product.

20 Claims, 14 Drawing Sheets

AUTOMATED INSERTING DEVICE FOR WORKPIECE ASSEMBLY

FIELD

The subject matter herein generally relates to inserting devices, and more particularly to an automated inserting device.

BACKGROUND

In the assembly of an electronic device, a number of memories are required to be carefully and repeatedly plugged into memory sockets. A reliable connection between the memory and the memory socket is directly related to the stability of the electronic device. Therefore, we need to ensure that each memory device is correctly and securely plugged into a memory socket. At present, the memories are manually plugged into the memory sockets, which is very inefficient. Therefore, there is room for improvement within the art.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
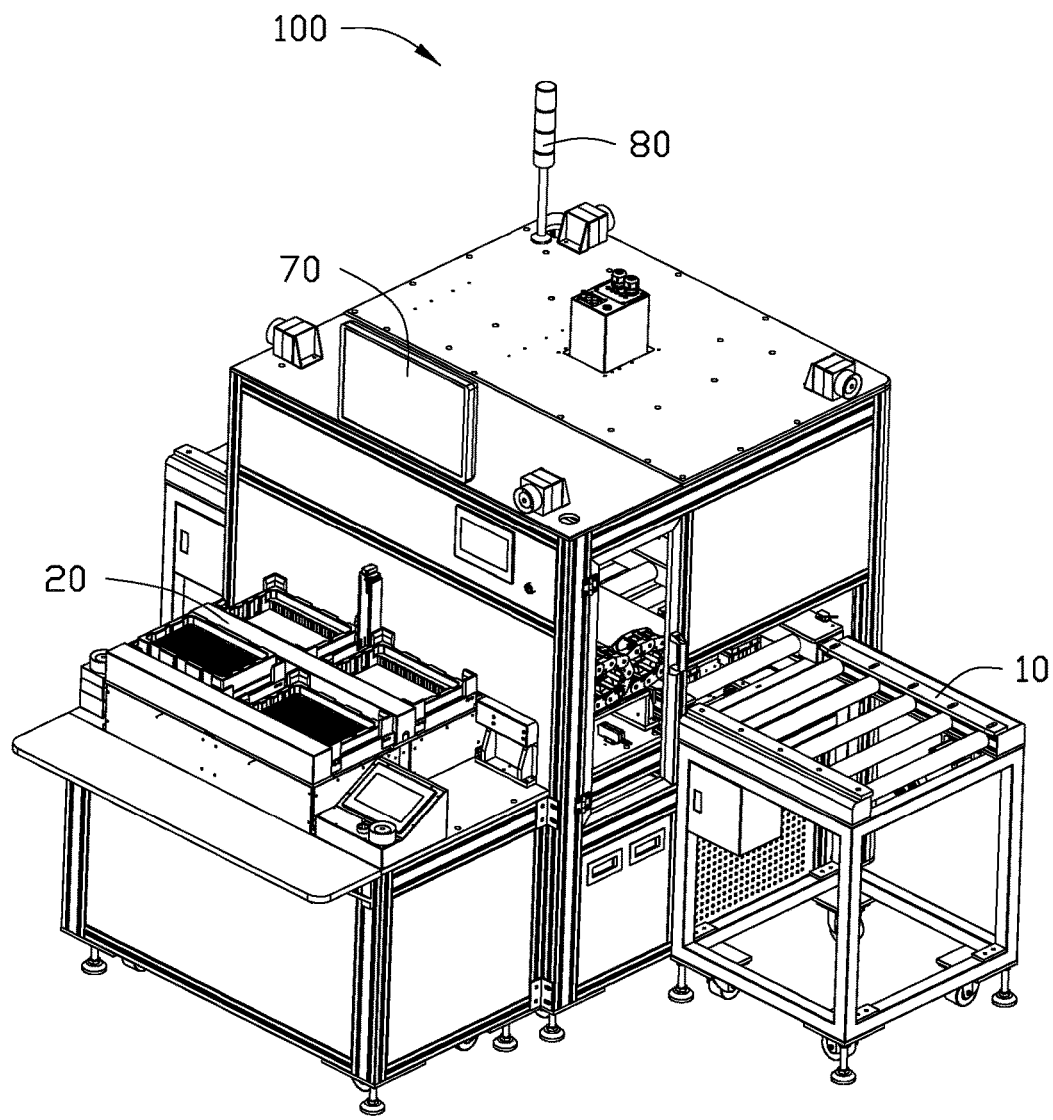
FIG. 1 is an isometric view of an exemplary embodiment of an inserting device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to an inserting device. The inserting device comprises a first feeding mechanism, a second feeding mechanism, a positioning mechanism, and a assembling mechanism. The first feeding mechanism is configured to convey a plurality of products one by one to an inserting position. The second feeding mechanism comprises a supporting structure, a lifting assembly, and a single-axis sliding table. The supporting structure comprises a first supporting plate, and a second supporting plate. The second supporting plate is positioned on the first supporting plate. The second supporting plate defines a first place position and an adjacent second place position side by side. The second supporting plate and the first supporting plate cooperatively form a receiving space. The lifting assembly is located below the first supporting plate. The lifting assembly passes through the first supporting plate and the second supporting plate and holds trays placed on the first place position and the second place position. The single-axis sliding table is received in the receiving space. The single-axis sliding table comprises a sliding block for receiving one tray dropped from the first place position each time and then moving the tray away from the first place position and the second place position. The positioning mechanism comprises a clamping jaw assembly and a positioning assembly. The clamping jaw assembly has a first clamp groove. The positioning assembly has a second clamp groove. The clamping jaw assembly clamps a workpiece from the tray held on the sliding block via the first clamp groove, and places the workpiece into the second clamp groove to position the workpiece. The assembling mechanism comprises a manipulator. The manipulator clamps the workpiece from the second clamp groove and inserts the workpiece into the product.

FIG. 1 illustrates an inserting device 100. The inserting device 100 can include a first feeding mechanism 10. The first feeding mechanism 10 can be configured to convey a number of products 200 (only one is shown in FIG. 2) to an inserting position 144 (shown in FIG. 3).

Figure 2:
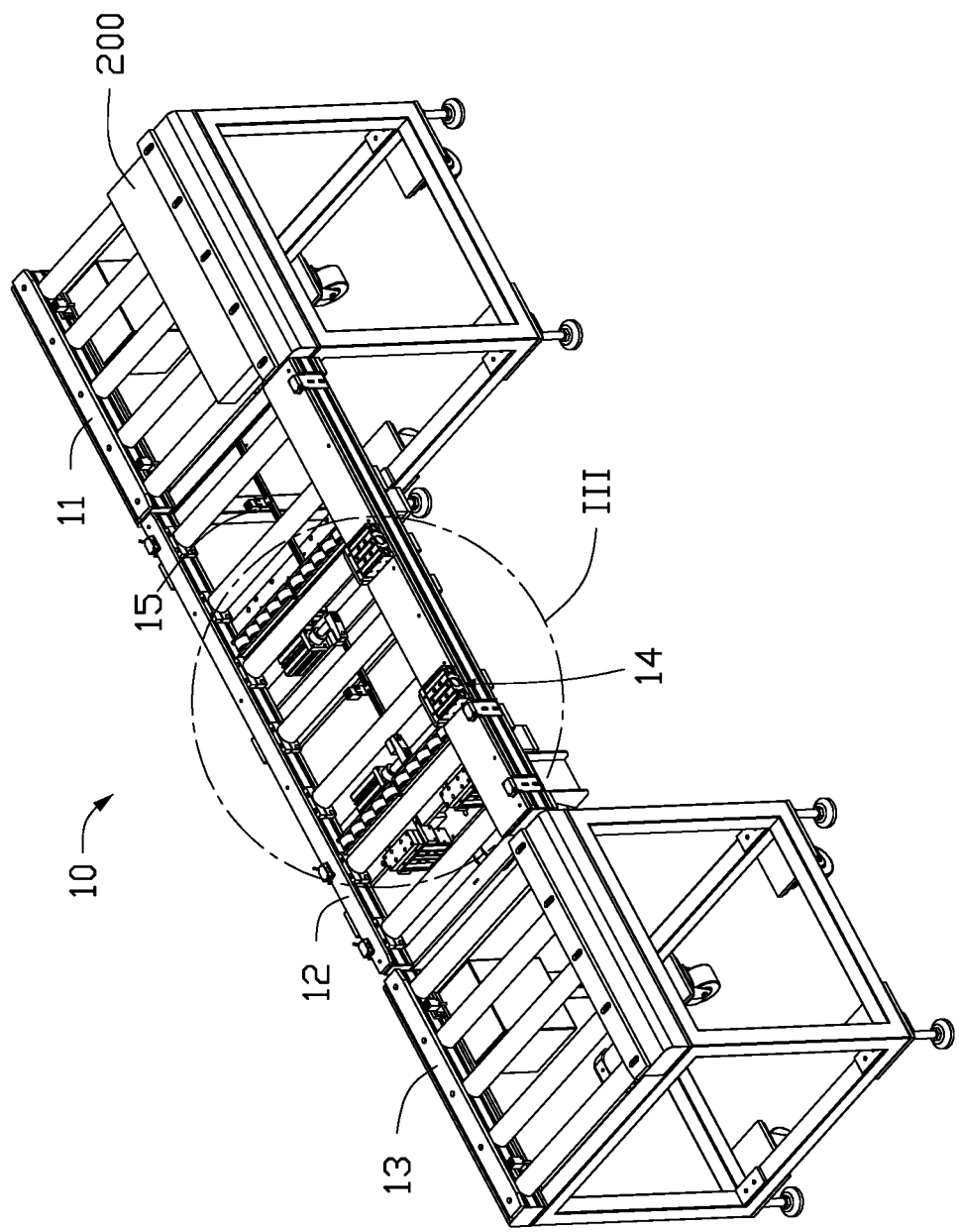
FIG. 2 is an isometric view of an exemplary embodiment of a first feeding mechanism of the inserting device.
Figure 3:
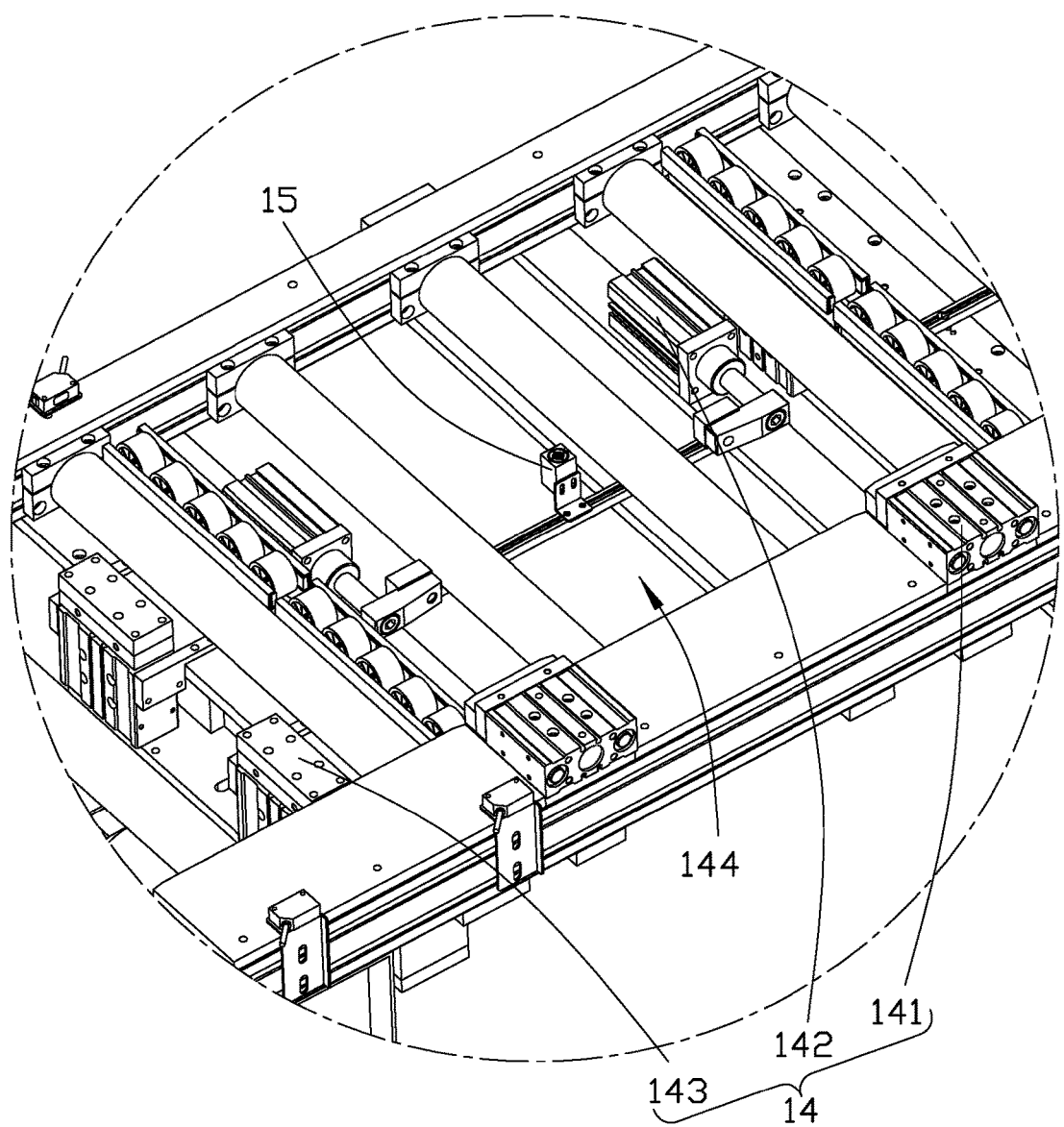
FIG. 3 is an enlarged view of circle III area of FIG. 2.

Referring to FIGS. 2 and 3, the first feeding mechanism 10 can include a first conveyor line 11, a second conveyor line 12 coupled to the first conveyor line 11, and a third conveyor line 13 coupled to the second conveyor line 12. The first feeding mechanism 10 can further include a blocking assembly 14. The blocking assembly 14 can be fixed to the second conveyor line 12. The blocking assembly 14 can block the product 200. When a number of memories are inserted into the product 200, the second conveyor line 12 can convey the product 200 to the third conveyor line 13. The blocking assembly 14 can include a first blocking member 141, a second blocking member 142, and a third blocking member 143. Each of the first blocking member 141, the second blocking member 142, and the third blocking member 143 is fixed to the second conveyor line 12. The first blocking member 141 and the second blocking member 142 can face each other, being located on the sides of the second conveyor line 12. The first blocking member 141 and the second blocking member 142 can be arranged along a direction parallel to a conveying direction of the second conveyor line 12. The third blocking member 143 can be located on a side of the first blocking member 141 and the second blocking member 142 farthest away from the first conveyor line 11. The inserting position 144 is defined by the first blocking member 141, the second blocking member 142 and the third blocking member 143. A length of the first blocking member 141, the second blocking member 142, and the third blocking member 143 can be adjusted to block products 200 with different sizes accordingly. In this embodiment, each of the first blocking member 141, the second blocking member 142, and the third blocking member 143 can include two cylinders.

The first feeding mechanism 10 can further include a sensing assembly 15. When the sensing assembly 15 senses that the product 200 is located in a predefined position, the first blocking member 141, the second blocking member 142, and the third blocking member 143 can cooperatively block the product 200 at the inserting position 144, such that the number of memories can be inserted in the product 200. The sensing assembly 15 can include a number of position sensors. One of the number of position sensors can be positioned on the side of the first blocking member 141 and the second blocking member 142 closer to the first conveyor line 11, such that the sensor can sense whether a product 200 is conveyed to the second conveyor line 12. When the one of the number of position sensors senses that the product 200 is conveyed to the second conveyor line 12, pushing rods of the first blocking member 141, the second blocking member 142, and the third blocking member 143 can extend and further block the product 200. In at least one embodiment, three of the number of position sensors can be respectively positioned on the pushing rods of the first blocking member 141, the second blocking member 142 and the third blocking member 143 respectively. When each of the three of the number of position sensors senses that the pushing rods abut the product 200, the pushing rod of the first blocking member 141, the second blocking member 142, and the third blocking member 143 can be stopped from extending to prevent damage to the product 200. After a predefined time, allowing for the number of memories to be inserted in the product 200, the pushing rods of the first blocking member 141, the second blocking member 142, and the third blocking member 143 can retract to allow product 200 to be conveyed to the third conveyor line 13.

Referring to FIG. 1, the inserting device 100 can further include a second feeding mechanism 20. The second feeding mechanism 20 can convey a tray which carries a number of memories and is manually placed on one or the other predefined positions.

Figure 4:
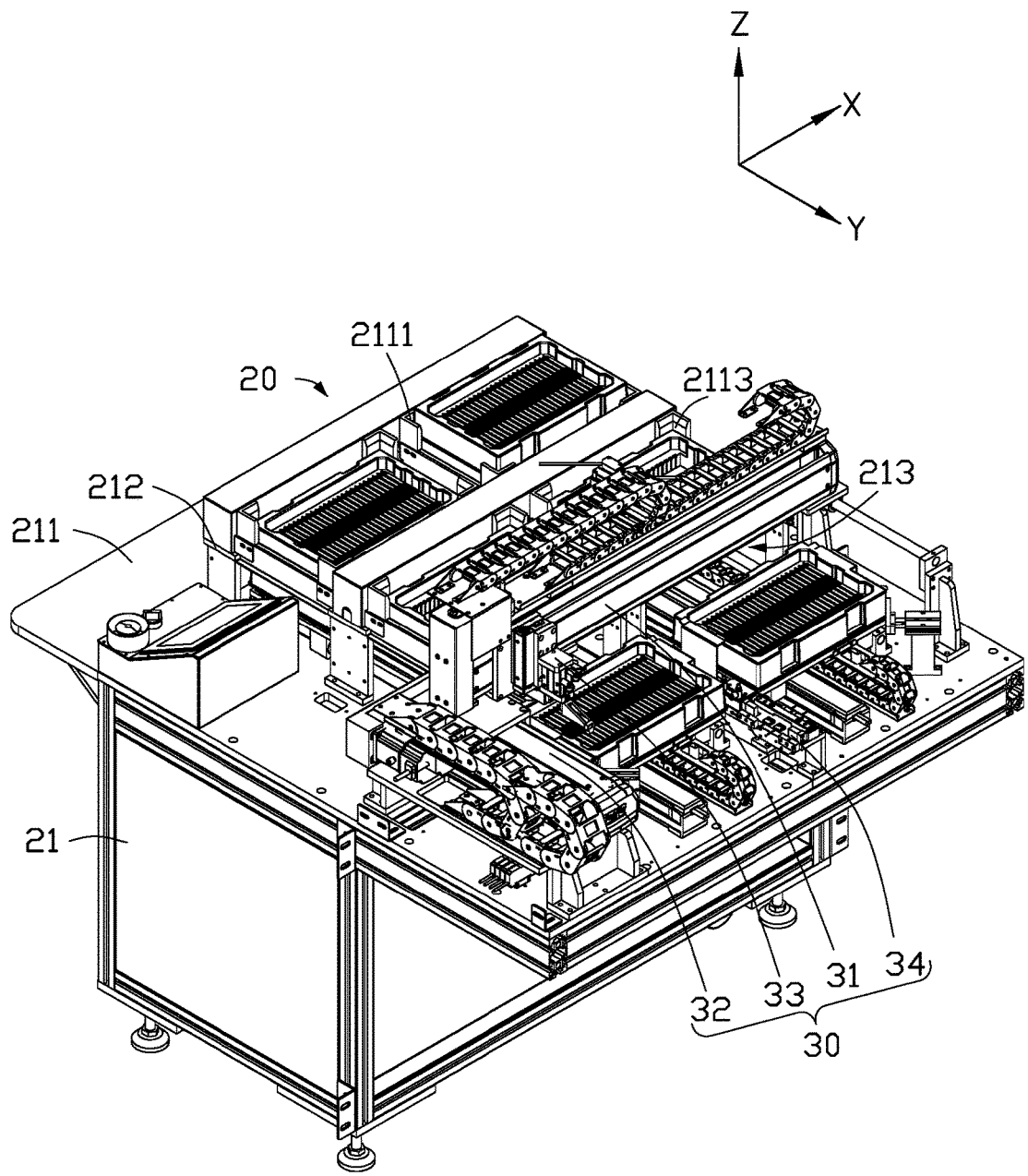
FIG. 4 is an isometric view of an exemplary embodiment of a second feeding mechanism and a positioning mechanism of the inserting device of FIG. 1.
Figure 5:
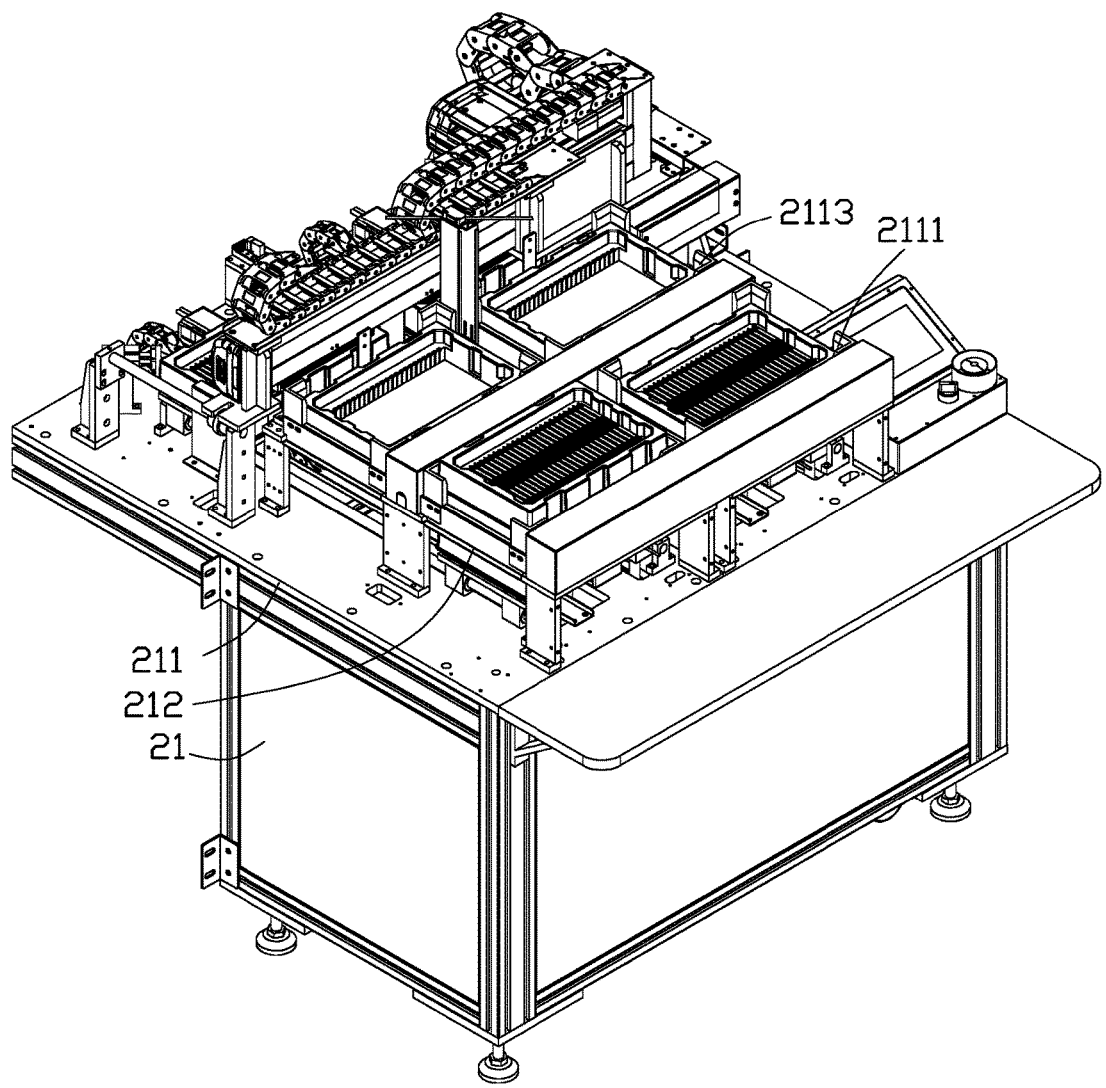
FIG. 5 is an isometric view of an exemplary embodiment of the second feeding mechanism and the positioning mechanism of the inserting device of FIG. 1 from another viewpoint.
Figure 6:
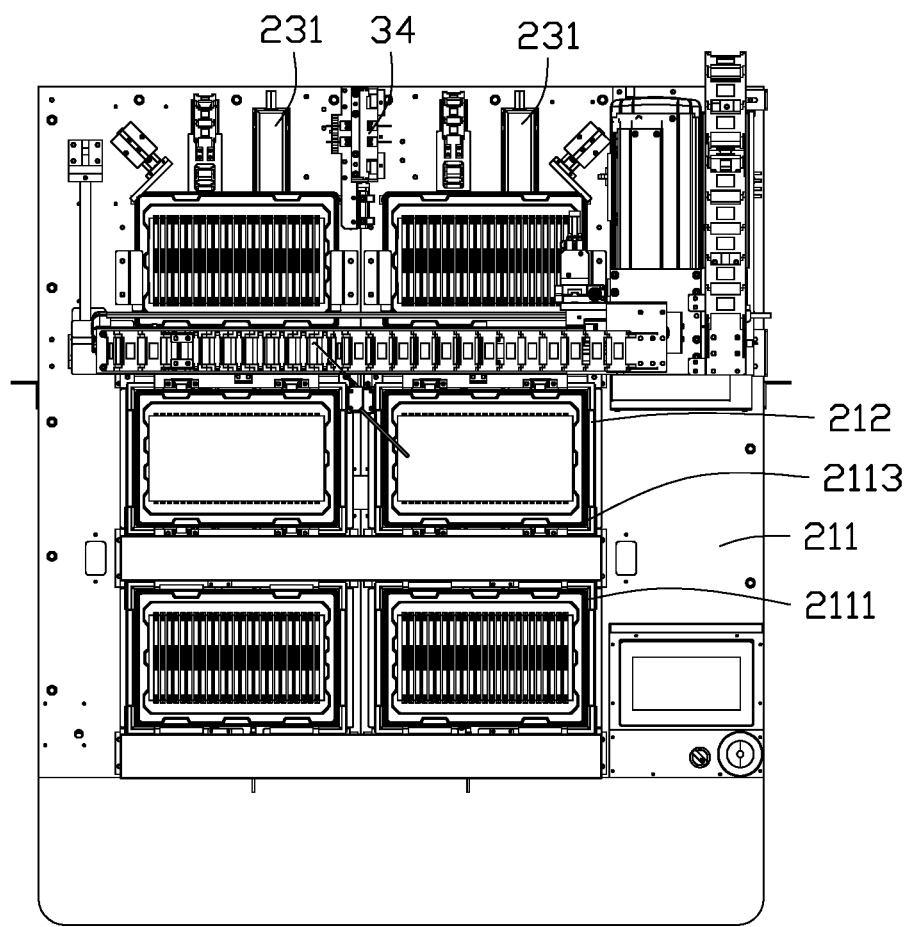
FIG. 6 is a plan view of the elements of FIG. 5.

Referring to FIGS. 4 to 6, the second feeding mechanism 20 can include a supporting structure 21. The supporting structure 21 can include a first supporting plate 211. The first supporting plate 211 can define a first place position 2111 and an adjacent second place position 2113 side by side. The first place position 2111 can be configured to place trays with memories manually loaded thereon. The second place position 2113 can be configured to place empty trays. In at least one embodiment, the first place position 2111 and the second place position 2113 can both stack a number of trays.

Figure 8:
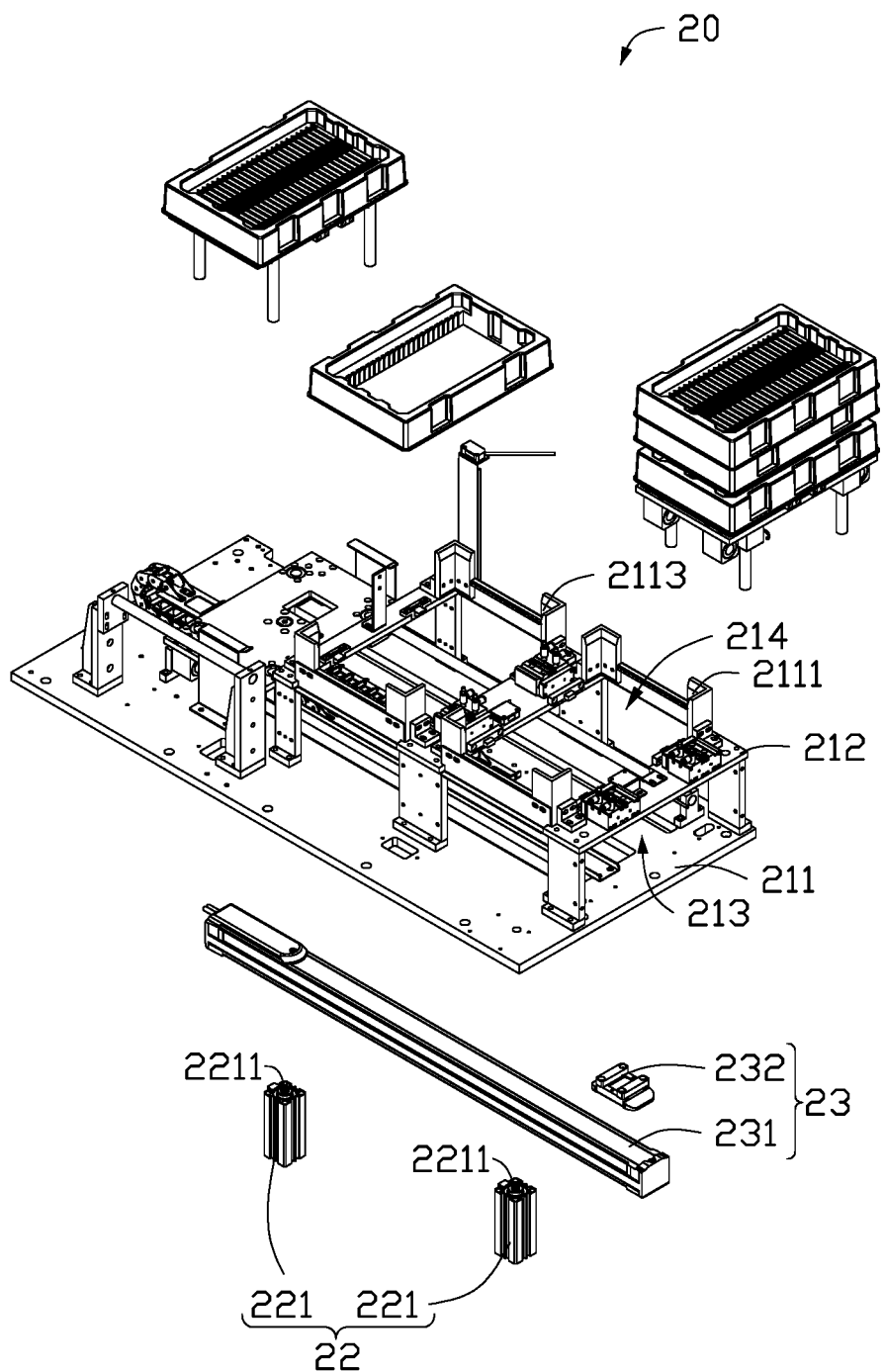
FIG. 8 is an exploded view of the element of FIG. 7.

The supporting structure 21 can include a second supporting plate 212. The second supporting plate 212 can be located above the first supporting plate 211, and further partially overlap the first supporting plate 211. The second supporting plate 212 and the first supporting plate 211 can cooperatively form a receiving space 213. The first place position 2111 and the second place position 2113 can be positioned on the second supporting plate 212. The second supporting plate 212 can further define two receive holes 214 (as shown in FIG. 8) corresponding to the first place position 2111 and the second place position 2113. The two receive holes 214 can allow trays to pass through.

Figure 7:
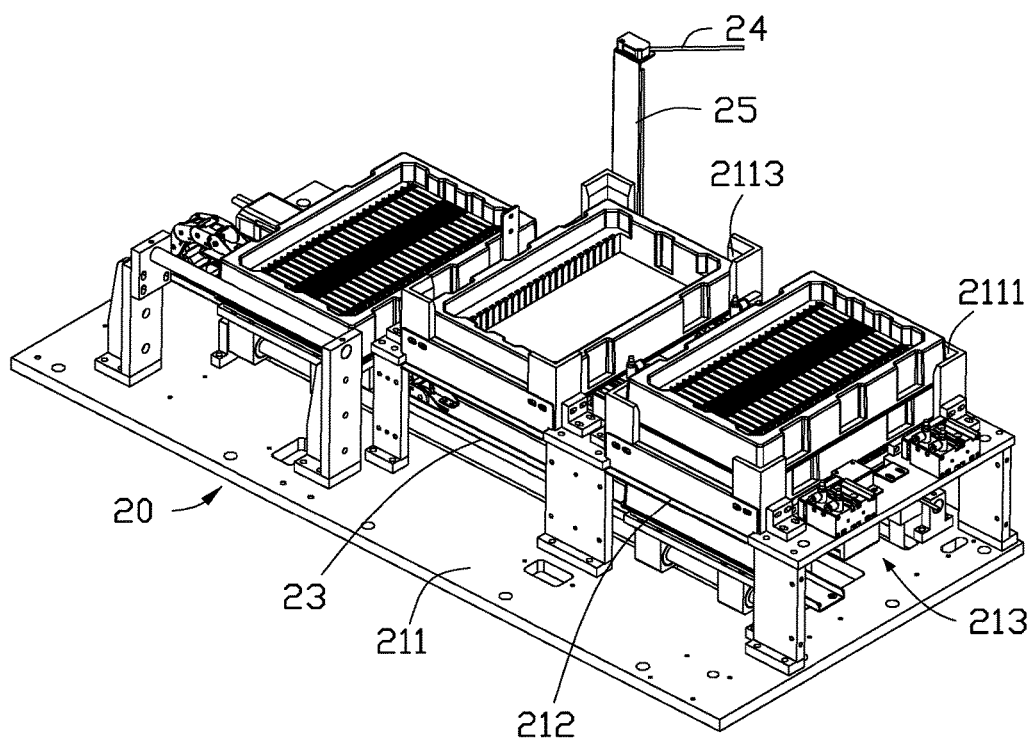
FIG. 7 is an isometric view of an exemplary embodiment of a second feeding mechanism of the inserting device.

Referring to FIGS. 7 and 8, the second feeding mechanism 20 can further include a lifting assembly 22. The lifting assembly 22 can include two lifting cylinders 221. The two lifting cylinders 221 can be positioned below the first supporting plate 211. Each lifting cylinder 221 can correspond to one of the two receive holes 214. The pushing rod 2211 of each lifting cylinder 221 can pass through the first supporting plate 211 and reach to below one of the two receive holes 214. The pushing rod 2211 of each lifting cylinder 221 can hold the trays placed on the first place position 2111 or on the second place position 2113.

The second feeding mechanism 20 can further include a single-axis sliding table 23. The single-axis sliding table 23 can be received in the receiving space 213. The single-axis sliding table 23 can include a single-axis guide 231, a sliding block 232, and a driving member (not shown). The single-axis guide 231 can be fixed on the first supporting plate 211, and spaced from the two lifting cylinders 221, such that the pushing rods 2211 of the two lifting cylinders 221 can extend and hold the trays placed on the first place position 2111 and the second place position 2113. The sliding block 232 can be slidably coupled to the single-axis guide 231. The driving member can be coupled to the sliding block 232. The driving member can drive the sliding block 232 to slide on the single-axis guide 231. When the tray is carried to one side away from the first place position 2111 by the sliding block 232, the memories carried in the tray can be clamped and then positioned. When the tray is empty, the tray can be carried by the sliding block 232 to the location below the second place position 2113. The lifting cylinder 221 below the second place position 2113 can lift the empty tray to pass through the receive hole 214 and place it in the second place position 2113. The sliding block 232 can be further driven to the location below the first place position 2111. At this time, the lifting cylinder 221 lifting the trays placed on the first place position 2111 can retract, and the trays can drop on the sliding block 232 under gravity. In at least one embodiment, a distance between the sliding block 232 and the second supporting plate 212 can allow one tray at a time to separate from other trays. At this time, the driving member can drive the sliding block 232 carrying the separated tray to move away from the first place position 2111, and the lifting cylinder 221 can extend again to hold other trays.

In at least one embodiment, the inserting device 100 can include at least two or more second feeding mechanisms 20. That is, the inserting device 100 can include two first place positions 2111, and two second place positions 2113. The number of lifting assemblies 22 and the single-axis sliding tables 23 can be two of each. When one of the two second feeding mechanisms 20 is conveying a tray, the other of the two second feeding mechanisms 20 can ensure that the tray located on the sliding block 232 has memories ready to assembled.

In at least one embodiment, the second feeding mechanism 20 can further include a height sensor 24. The height sensor 24 is fixed to the first supporting plate 211 via a supporting rod 25. The height sensor 24 can be adjacent to the second place position 2113. The height sensor 24 can sense a total height of trays stacked on the second place position 2113. If the total height is greater than a predefined height, the height sensor 24 can generate a sensing signal. In at least one embodiment, the height sensor 24 can be omitted provided the empty trays placed on the second place position 2114 are removed manually.

Referring to FIG. 4, the inserting device 100 can further include a positioning mechanism 30. When the sliding block 232 is located on one side close to the positioning mechanism 30, the positioning mechanism 30 can clamp a memory from the tray located on the sliding block 232 and then position the memory.

The positioning mechanism 30 can include an X-axis guide 31. The X-axis guide 31 can be positioned along an X-direction, and further positioned above the second supporting plate 212.

The positioning mechanism 30 can further include a Y-axis guide 32. The Y-axis guide 32 can be positioned along a Y-direction, and further coupled to the first supporting plate 211 directly. The X-axis guide 31 can be coupled to the Y-axis guide 32. The Y-axis guide 32 can slide on the X-axis guide 31.

The positioning mechanism 30 can further include a clamping jaw assembly 33. The clamping jaw assembly 33 can be positioned on one end of Y-axis guide 32 close to the X-axis guide 31. The clamping jaw assembly 33 can be slidably positioned on the Y-axis guide 32. The clamping jaw assembly 33 can slide on the X-axis guide 31 to follow the Y-axis guide 32 along the X-direction.

Figure 9:
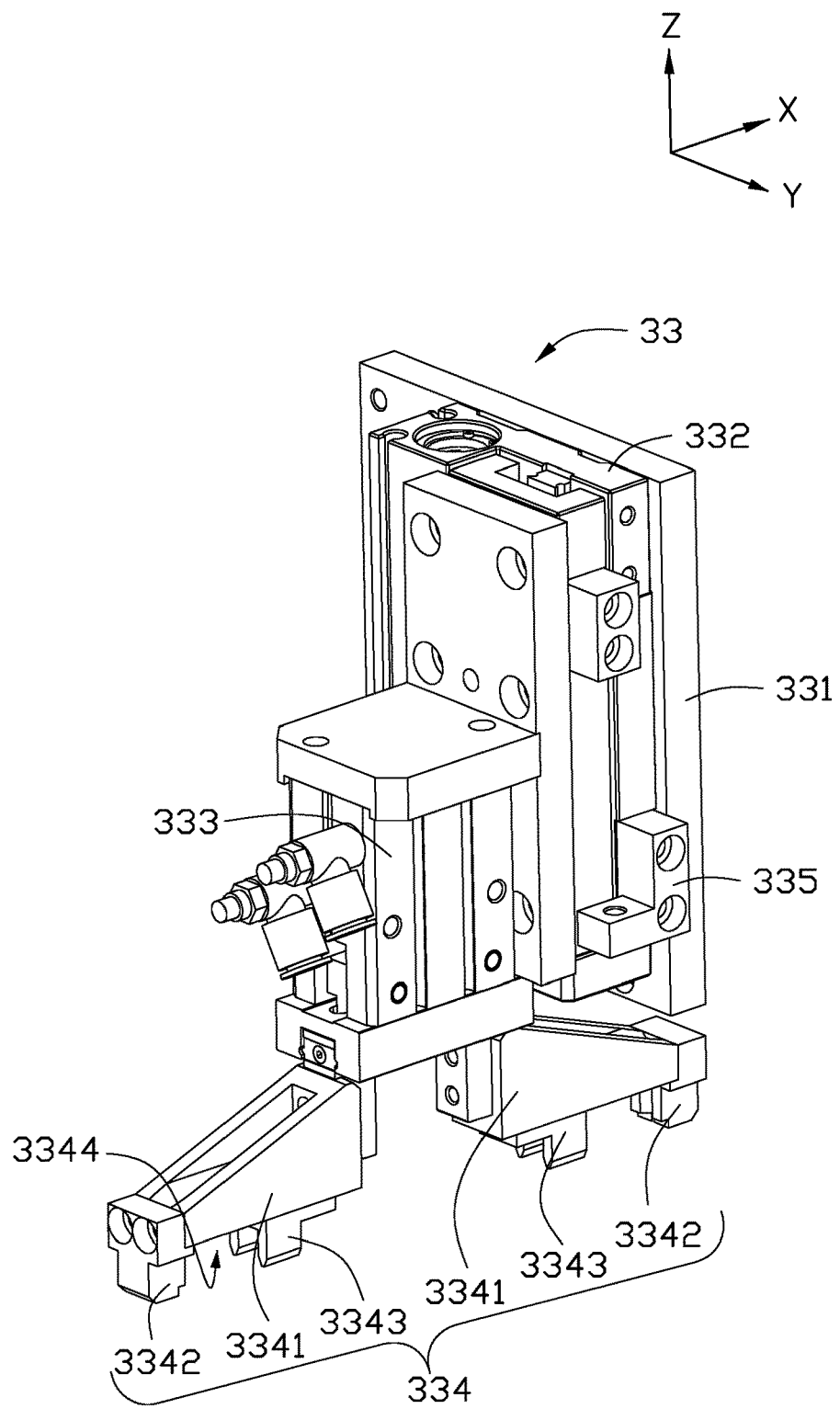
FIG. 9 is an isometric view of an exemplary embodiment of the inserting device in the act of clamping.

Referring to FIGS. 4 and 9, the clamping jaw assembly 33 can include a fixed plate 331. The fixed plate 331 can be slidably coupled to the Y-axis guide 32. The clamping jaw assembly 33 can include a precise slide cylinder 332 positioned on the fixed plate 331. The precise slide cylinder 332 can slide along a z-direction. The clamping jaw assembly 33 can further include a parallel gripper cylinder 333 positioned on the opposite side of the precise slide cylinder 332 away from the fixed plate 331. The parallel gripper cylinder 333 can slide along the Z-direction to follow the precise slide cylinder 332. The clamping jaw assembly 33 can further include a clamping jaw 334 positioned on one end of the parallel gripper cylinder 333 close to the first supporting plate 211. The clamping jaw 334 can be fixed to a pushing plate of the parallel gripper cylinder 333. The clamping jaw 334 can include two clamping bodies 3341 substantially in a shape of right triangle. The two clamping bodies 3341 can face each other. The parallel gripper cylinder 333 can drive the two clamping bodies 3341 towards or away from each other. The clamping jaw 334 can further include two first clamping portions 3342 and two second clamping portions 3343 positioned on one side of the clamping body 3341 closer to the first supporting plate 211. Each first clamping portion 3342 can be located on one side of one clamping body 3341 away from the other clamping body 3341. The two first clamping portions 3342 can clamp the two short edges of the memory. Each second clamping portion 3343 can be located on a middle portion of each clamping body 3341. The two second clamping portions 3343 can clamp the two long edges of the memory. The two first clamping portions 3342 and the two second clamping portions 3343 can cooperatively form a first clamp groove 3344 for accommodating a memory. When the clamping jaw assembly 33 needs to clamp a memory from the tray carried on the sliding block 232, the parallel gripper cylinder 333 can drive the two clamping bodies 3341 to move towards each other, such that the two first clamping portions 3342 can clamp the two short edges of the memory. The two second clamping portions 3343 can clamp the two long edges of the memory, thereby the memory can be clamped in the first clamp groove 3344. When the clamping jaw assembly 33 needs to release the memory, the parallel gripper cylinder 333 can drive the two clamping bodies 3341 to move apart so a distance between the two first clamping portions 3342 is greater than a long side of the memory, the memory then drops from the first clamp groove 344. The clamping jaw assembly 33 can further include a blocking member 335. The blocking member 335 can be substantially L-shaped, and further be fixed on the fixed plate 331. The blocking member 335 can limit movements of the parallel gripper cylinder 333 and the clamping jaw 334.

Figure 10:
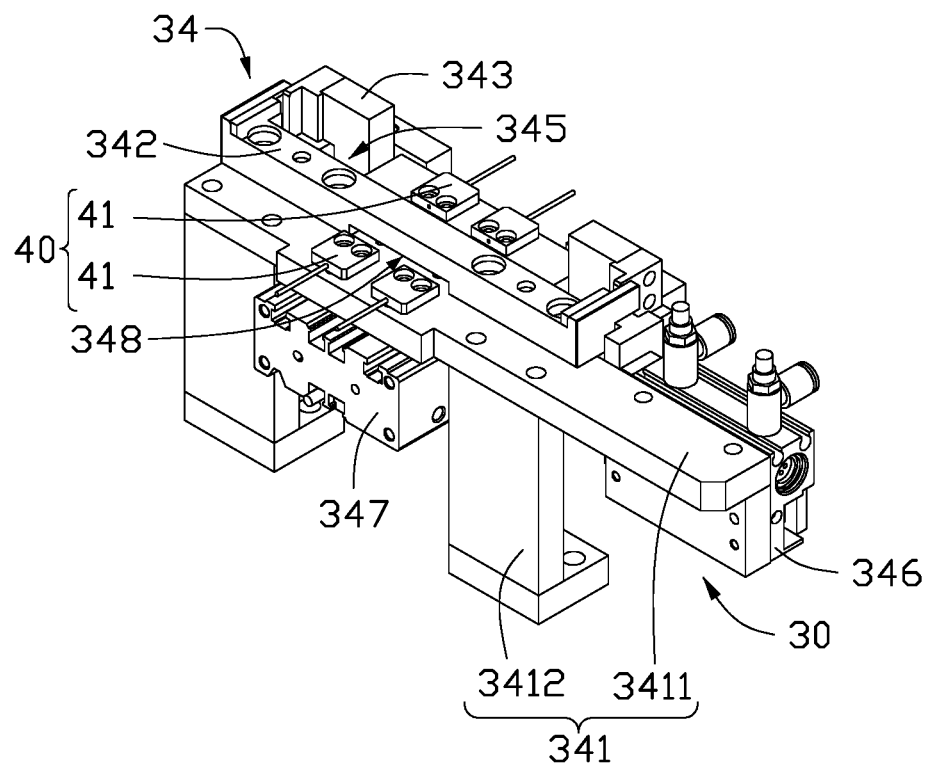
FIG. 10 is an isometric view of an exemplary embodiment of a positioning mechanism of the inserting device.

Referring to FIG. 10, the positioning mechanism 30 can further include a positioning assembly 34. The positioning assembly 34 can include a supporting portion 341. The supporting portion 341 can include a third supporting plate 3411 and a number of supporting posts 3412. The number of supporting posts 3412 can be L-shaped. The third supporting plate 3411 can be positioned on the first supporting plate 211 via the number of supporting posts 3412. Referring to FIG. 6, the supporting portion 341 can be located between the two single-axis guides 231. Referring to FIG. 10, the positioning assembly 34 can further include a first clamper 342 substantially in U-shaped and a second clamper 343. The second clamper 343 can be formed by two L-shaped clampers. The two L-shaped clampers can be spaced from each other, such that an opening can be formed between the two L-shaped clampers. Therein, the first clamper 342 and the second clamper 343 can face each other. The first clamper 342 and the second clamper 343 can cooperatively form a second clamp groove 345. The first clamper 342 and the second clamper 343 can be movably positioned on the third supporting plate 3411. The positioning assembly 34 can further include a short edge clamp cylinder 346. The short edge clamp cylinder 346 can be coupled to a short edge of the first clamper 342. The short edge clamp cylinder 346 can move the first clamper 342 in a longitudinal direction of the first clamper 342. The positioning assembly 34 can further include a long edge clamp cylinder 347. The long edge clamp cylinder 347 can be coupled to the second clamper 343, and the long edge clamp cylinder 347 can move the second clamper 343 across, that is along a width direction of the first clamper 342, such that a size of the second clamp groove 345 can be varied to clamp memories or other suitable members of different sizes. Referring to FIG. 9, the clamping jaw assembly 33 can clamp the memory from the tray carried on the sliding block 232 via the first clamp groove 3344, and further carry the memory to the second clamp groove 345 to position the memory secondly.

Referring to FIG. 10, the inserting device 100 can further include an orientation detecting mechanism 40. The orientation detecting mechanism 40 can be configured to detect whether an orientation of the memory to be inserted is correct. The orientation detecting mechanism 40 can include at least one pair of optical sensors 41. The at least one pair of optical sensors 41 can be positioned below the first clamper 342 and on the third supporting plate 3411 close to the second clamper 343. In at least one embodiment, the first clamper 342 can define an opening 348 facing the third supporting plate 3411. One of the at least one pair of optical sensors 41 can be positioned in the opening 348. When a memory is inserted into the second clamp groove 345, the at least one pair of optical sensors 41 will be on both sides of the memory. One of the at least one pair of optical sensors 41 sends a signal, the other of the at least one pair of optical sensors 41 receives the signal. The orientation of the memory can physically obstruct the signal from reaching the other one of the at least one pair of optical sensors 41. If the signal is not blocked, the orientation of the memory is correct, and the at least one pair of optical sensors 41 transmit a first sensing signal. Otherwise, the at least one pair of optical sensors 41 transmit a second sensing signal.

In at least one embodiment, if the orientation of the memory can be checked and corrected manually, the orientation detecting mechanism 40 can be omitted.

Figure 11:
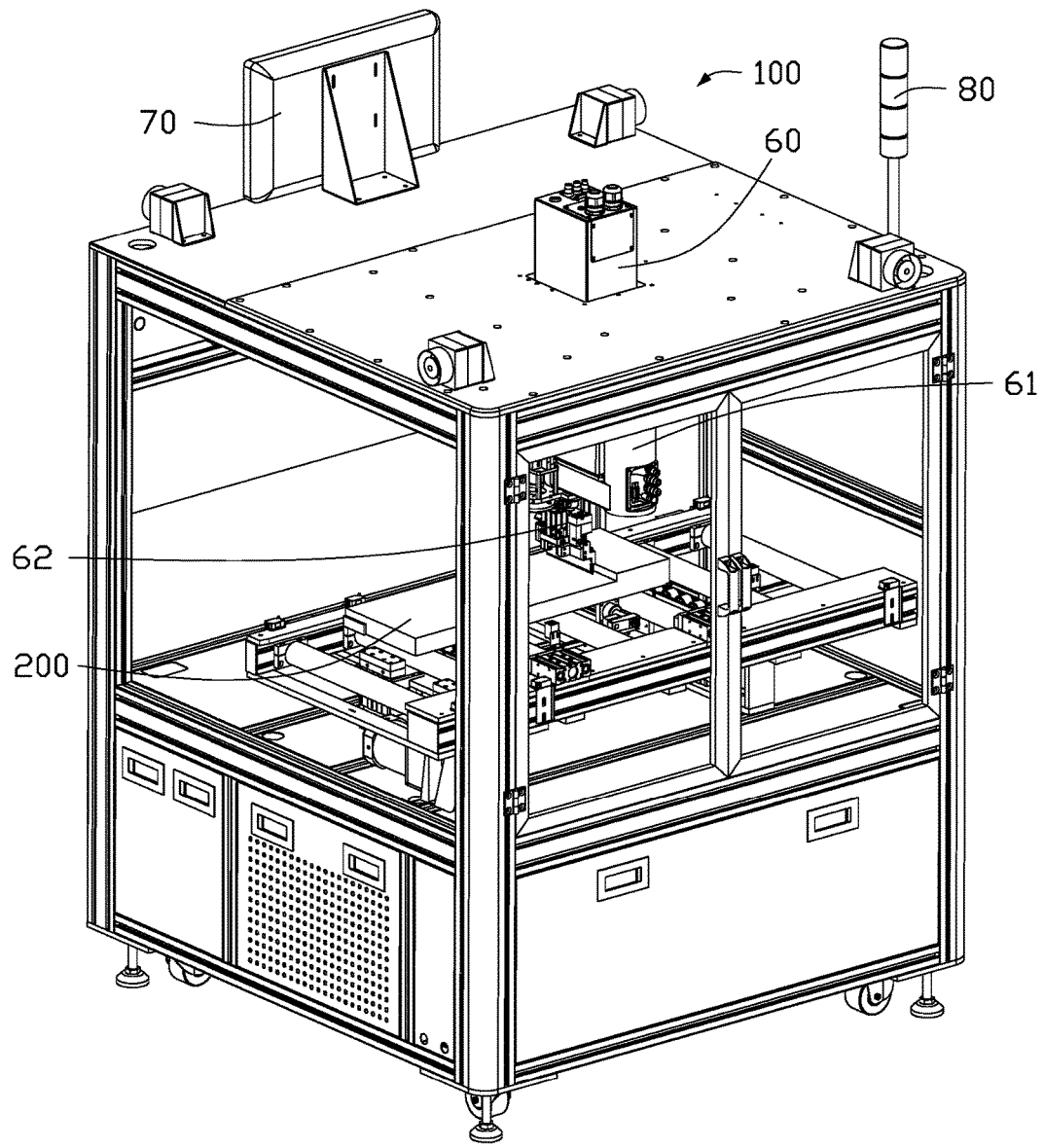
FIG. 11 is a partial, isometric view of an exemplary embodiment of the inserting device.
Figure 12:
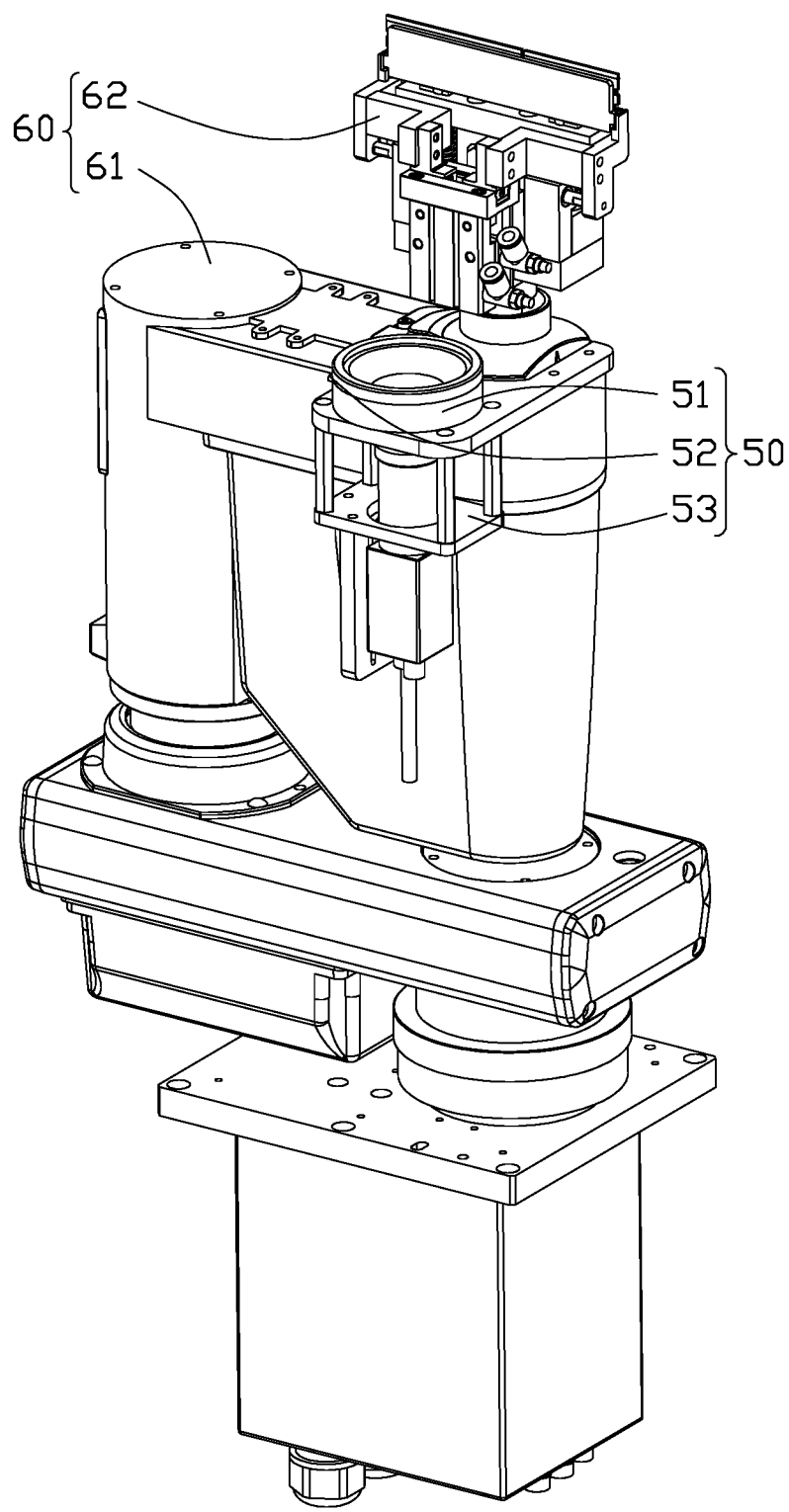
FIG. 12 is an isometric view of an exemplary embodiment of a visual system and a assembling mechanism of the element of FIG. 11.

Referring to FIGS. 11 and 12, the inserting device 100 can further include a visual system 50. The visual system 50 can obtain coordinates of a memory socket (not shown) of the product 200, according to a shape of the product 200. The visual system 50 can include a camera unit 51. In this embodiment, the camera unit 51 can be a charge coupled device (CCD) camera. The camera unit 51 can take a picture of the product 200 located on the second conveyor line 12, and further determine a kind of the product 200 according to the picture. The visual system 50 can further include a light unit 52. The light unit 52 can be positioned on the camera unit 51. In this embodiment, the light unit 52 can be an LED light. The light unit 52 can increase light luminance when the ambient light luminance is insufficient. The visual system 50 can further include a fixed bracket 53. The fixed bracket 53 can be hollow. The camera unit 51 can be fixed in the fixed bracket 53.

In at least one embodiment, if the kind of the product 200 is known, and the coordinates of the memory socket of the product 200 are known in advance, the visual system 50 can be omitted.

The inserting device 100 can further include an assembling mechanism 60. The assembling mechanism 60 can clamp the memory from the second clamp groove 345 and further press the memory into the memory socket of the product 200 if the orientation of memory is correct. The assembling mechanism 60 can further include a multi-axial robot 61. The fixed bracket 53 can be positioned on one end of the multi-axial robot 61. The assembling mechanism 60 can further include a manipulator 62. The manipulator 62 can be coupled to the multi-axial robot 61. The manipulator 62 and the visual system 50 can be positioned on a same end of the multi-axial robot 61.

Figure 13:
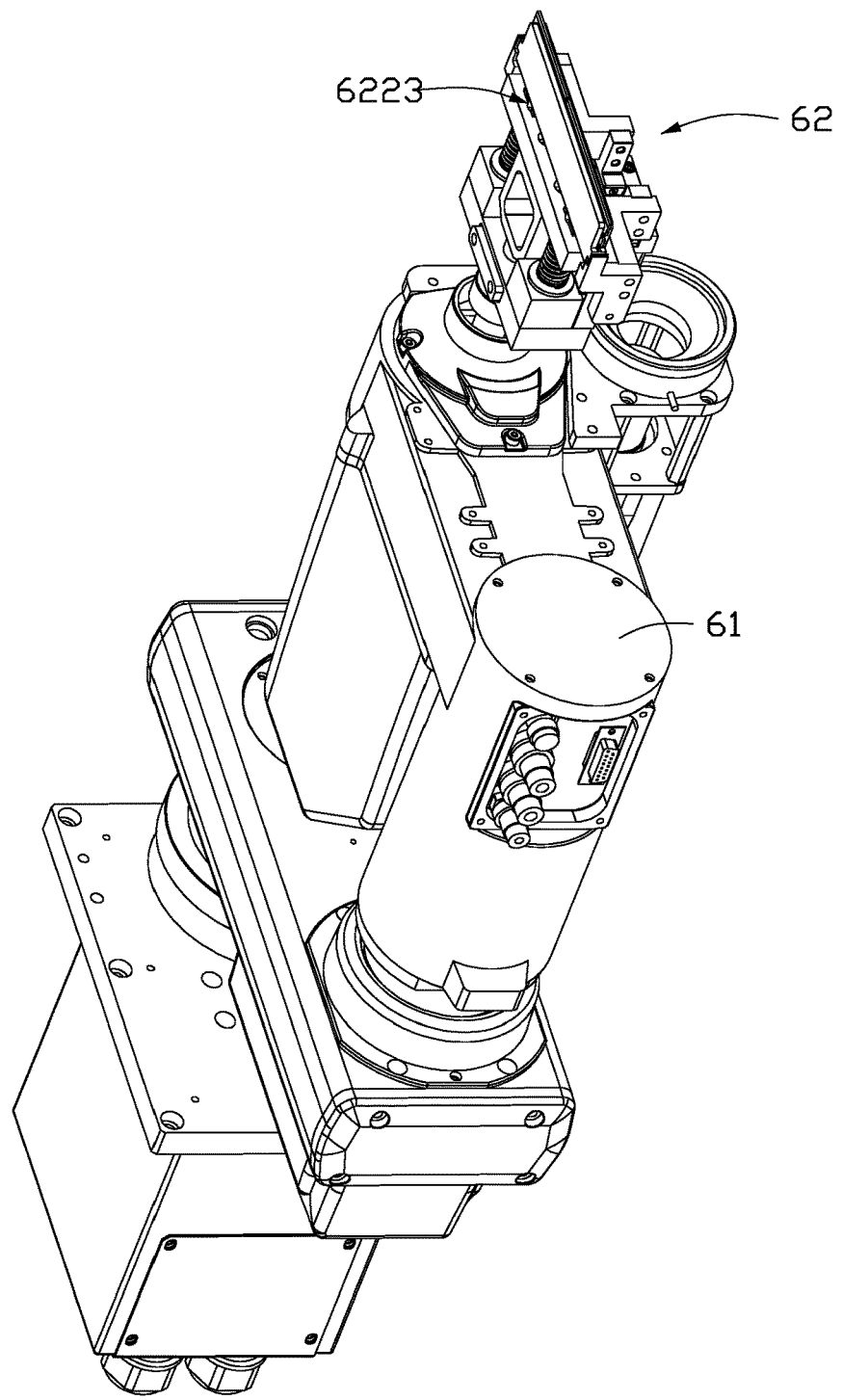
FIG. 13 is an isometric view of an exemplary embodiment of the visual system and the assembling mechanism of FIG. 12 from another point of view.
Figure 14:
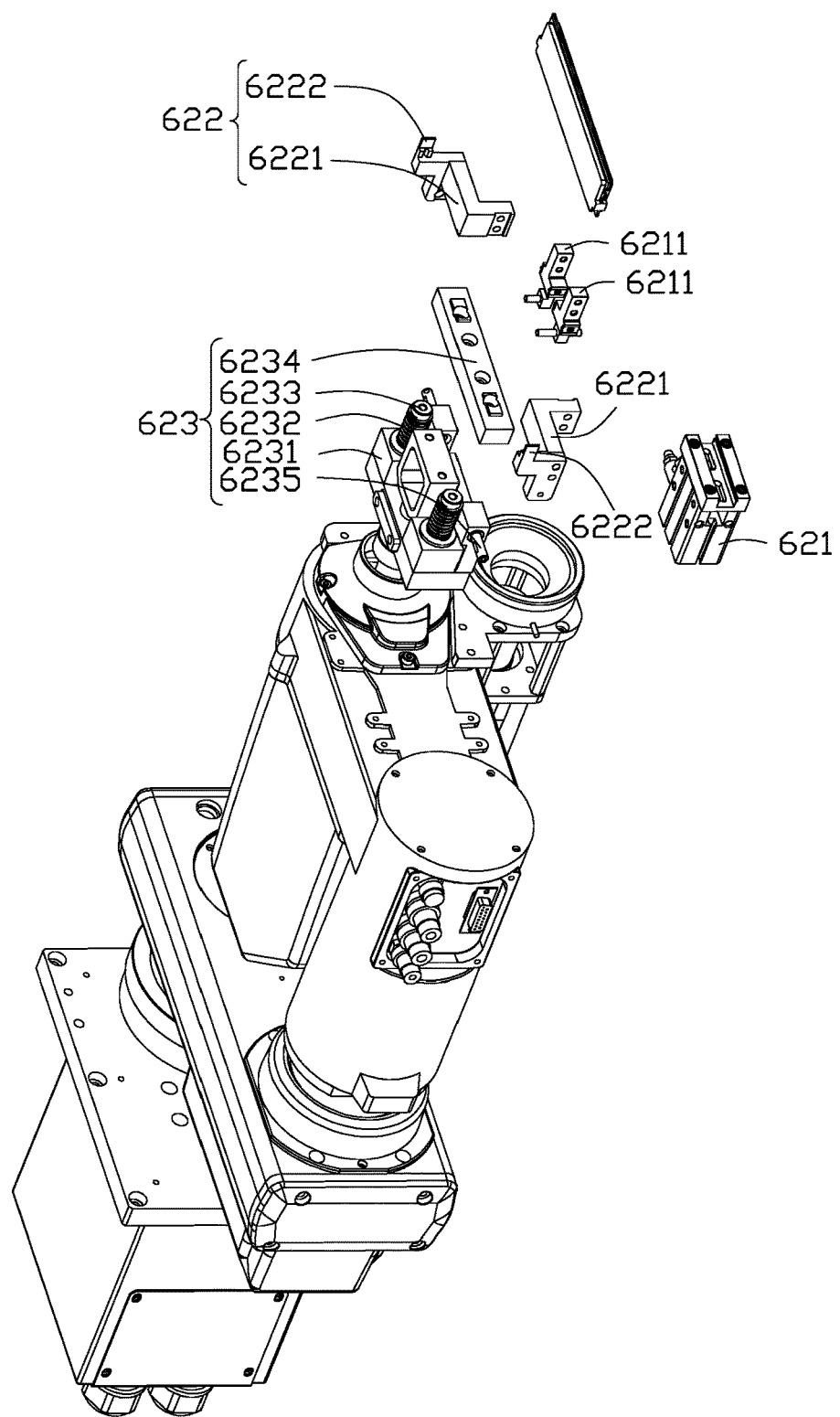
FIG. 14 is an exploded view of the elements of FIG. 13.

Referring to FIGS. 13 and 14, the manipulator 62 can include a parallel gripper cylinder 621. One end of the parallel gripper cylinder 621 can be positioned on the multi-axial robot 61, and the other end of the parallel gripper cylinder 621 can attach to the two L-shaped clamping jaws 6211 which face each other. The parallel gripper cylinder 621 can drive the two L-shaped clamping jaws 6211 to move towards and away from each other. The manipulator 62 can include a pair of two clamping members 622. Each pair of clamping members 622 can include a stepped connecting portion 6221 and a clamping portion 6222 coupled to one end of the stepped connecting portion 6221. Each stepped connecting portion 6221 can be coupled to one end of one L-shaped clamping jaw 6211 away from the other L-shaped clamping jaw 6211. The two clamping portions 6222 can cooperatively form a clamp groove 6223 for receiving the memory. The manipulator 62 can further include a buffering assembly 623. The buffering assembly 623 can include a base 6231, at least one buffering device 6232, at least one supporting rod 6233 and a bottom plate 6234. The at least one buffering device 6232 can be located between the base 6231 and the bottom plate 6234. The at least one supporting rod 6233 can couple the base 6231 with the bottom plate 6234. Each buffering device 6232 can wrap over one of the at least one supporting rod 6233, such that the buffering device 6232 can be guided by the supporting rod 6233. The bottom plate 6234 can be pivoted between the two stepped connecting portions 6221 via a pivot 6235. When the two clamping portions 6222 clamp the memory so the memory abuts the bottom plate 6234, the buffering device 6232 can provide a restoring force or flexibility in receiving the memory to avoid damage to the memory. In at least one embodiment, the at least one buffering device 6232 can be a spring. In at least one embodiment, the at least one buffering device 6232 can couple the base 6231 to the bottom plate 6234 and the at least one supporting rod 6233 can be omitted. In at least one embodiment, if the multi-axial robot 61 has sufficient flexibility or resilience, the buffering assembly 623 can be omitted.

Referring to FIG. 1, the inserting device 100 can further include a control system 70. The control system 70 can control the first feeding mechanism 10, the second feeding mechanism 20, the positioning mechanism 30 (shown in FIG. 4), the orientation detecting mechanism 40 (shown in FIG. 10), the visual system 50 (shown in FIG. 12) and the assembling mechanism 60 (shown in FIG. 14) to work in harmony according to the number of sensors positioned on any locations of the inserting device 100.

The control system 70 can control the pushing rods of the first blocking member 141, the second blocking member 142 and the third blocking member 143 (shown in FIG. 3) to extend to block the product 200 when the one of the number of position sensors senses that the product 200 is conveyed to the second conveyor line 12. The control system 70 can control the pushing rods of the first blocking member 141, the second blocking member 142 and the third blocking member 143 to stop extending when the three of the number of position sensors sense that the pushing rods have abutted the product 200, to avoid destruction of the product 200. The control system 70 can further control the pushing rods of the first blocking member 141, the second blocking member 142, and the third blocking member 143 to retract after the memories have been inserted into the product 200. The product 200 can be conveyed to the third conveyor line 13 by the second conveyor line 12.

The control system 70 can control a warning unit 80 (as shown in FIG. 1) to warn users to remove empty trays in timely manner when the sensing signal generated by the height sensor 24 is received.

The control system 70 determines that the orientation of the memory is correct when the first sensing signal is received. The control system 70 determines that the orientation of the memory is incorrect when the second sensing signal is received. In at least one embodiment, the control system 70 can control the warning unit 80 to warn users when the orientation of the memory is incorrect. The control system 70 can further control the multi-axial robot 61 to turn over the memory such that the memory can be correctly inserted into the product 200. The control system 70 can further control the visual system 50 to work when the orientation of the memory is correct. The visual system 50 can obtain a picture (or other visual information) of the product 200 and provide feedback to the control system 70 on the kind of inserting device according to the picture taken.

The control system 70 can obtain point site data corresponding to the kind of the product 200 from the visual system 50. The control system 70 can control the cameral unit 51 to capture pictures of actual positions of two certain points of the product 200. The control system 70 can calculate a coordinate system of the product 200 according to the actual positions of the two certain points in the pictures captured. The control system 70 can further calculate coordinates of the memory socket. The multi-axial robot 61 can drive the manipulator 62 to clamp a memory from the second clamp groove 345 and further insert the memory into the memory socket of the product 200 according to the coordinates of the memory socket. When the memory is inserted into the product 200, the multi-axial robot 61 returns to an original position for insertion operation of next memory, until all needed memories are installed in the product 200.

The memory is only exemplary of one type of inserting device. In at least one embodiment, the inserting device can be configured to insert other electrical members and components such as a CPU. The memory and the CPU and other devices are all workpieces in this disclosure.

The exemplary embodiments shown and described above are only examples. Many details are often found in the art such as the features of inserting device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. An inserting device, comprising:
 a first feeding mechanism configured to convey a plurality of products one by one to an inserting position;
 a second feeding mechanism, the second feeding mechanism comprising:
  a supporting structure, comprising:
   a first supporting plate;
   a second supporting plate positioned on the first supporting plate, the second supporting plate defining a first place position and an adjacent second place position, the second supporting plate and the first supporting plate cooperatively forming a receiving space;
  a lifting assembly comprising lifting cylinders each with a pushing rod, the lifting cylinders are located below the first supporting plate, the pushing rod of each lifting cylinder passing through the first supporting plate and below the second supporting plate, wherein the pushing rod of each lifting cylinder is configured to hold trays placed on the first place position and the second place position; and
  a single-axis sliding table received in the receiving space, the single-axis sliding table comprising a sliding block configured to receive at least one tray dropped from the first place position and further configured to move the tray away from the first place position and towards the second place position;
 a positioning mechanism comprising a clamping jaw assembly and a positioning assembly, the clamping jaw assembly having a first clamp groove, the positioning assembly having a second clamp groove, the clamping jaw assembly configured to clamp a workpiece from the tray held on the sliding block via the first clamp groove, and further place the workpiece into the second clamp groove to position the workpiece secondly; and
 an assembling mechanism comprising a manipulator, the manipulator configured to clamp the workpiece from the second clamp groove and insert the workpiece into the product.

2. The inserting device of claim 1, wherein the first feeding mechanism comprises a first conveyor line, a second conveyor line coupled to the first conveyor line, and a third conveyor line coupled to the second conveyor line, the first feeding mechanism comprises a blocking assembly, the blocking assembly is positioned on the second conveyor line.

3. The inserting device of claim 2, wherein the blocking assembly comprises a first blocking member, a second blocking member and a third blocking member; the first blocking member faces the second blocking member; the first blocking member and the second blocking member are located on sides of the second conveyor line, and are arranged along a direction parallel to a conveying direction of the second conveyor line; the third blocking member is located on a side of the first blocking member and the second blocking member farthest away from the first conveyor line, the inserting position is determined by the positioning of the second blocking member and the third blocking member both of which place the product for insertion.

4. The inserting device of claim 3, wherein the first feeding mechanism further comprises a sensing assembly configured to detect a presence of the product located on a side of the first blocking member and the second blocking member close to the first conveyor line, and configured to drive the first blocking member, the second blocking member, and the third blocking member to cooperatively place the product in the inserting position.

5. The inserting device of claim 1, wherein the second supporting plate defines two receive holes corresponding to the first place position and the second place position respectively, each of the two lifting cylinders is located below the first place position and the second place position and is configured to pass through one of the two receive holes to hold the trays placed on the first place position or the second place position.

6. The inserting device of claim 5, wherein the lifting cylinder which is located below the second place position is configured to lift the tray to pass through the receive hole corresponding to the second place position, and further configured to place the tray on the second place position.

7. The inserting device of claim 6, wherein the second feeding mechanism further comprises a height sensor, the height sensor is fixed to the first supporting plate, the height sensor is adjacent to the second place position, the height sensor is configured to sense a total height of the trays stacked on the second place position.

8. The inserting device of claim 1, wherein the lifting assembly comprises two lifting cylinders, the two lifting cylinders are located below the first place position and the second place position respectively, the single-axis sliding table comprises a single-axis guide, the single-axis guide is fixed on the first supporting plate, and further spaced from the two lifting cylinders, the sliding block is slidably coupled to the single-axis guide.

9. The inserting device of claim 1, wherein the positioning mechanism comprises:
an X-axis guide, the X-axis guide positioned along an X-direction, and located above the second supporting plate;
a Y-axis guide, the Y-axis guide positioned along a Y-direction and fixed to the first supporting plate, wherein the X-axis guide couples with the Y-axis guide, the X-axis guide is capable of sliding on the Y-axis guide;
wherein the clamping jaw assembly is slidably coupled to one end of the X-axis guide Y axis guide close to the Y-axis guide, the clamping jaw assembly slides along the Y-direction on the Y-axis guide following the X-axis guide.

10. The inserting device of claim 9, wherein the clamping jaw assembly comprises:
a fixed plate slidably coupled to the Y-axis guide;
a precise slide cylinder positioned on the fixed plate, the precise slide cylinder slides along a Z-direction;
a parallel gripper cylinder, the parallel gripper cylinder positioned on the precise slide cylinder, the parallel gripper cylinder sliding along the Z-direction and following the precise slide cylinder; and
a clamping jaw, the clamping jaw positioned on one side of the parallel gripper cylinder close to the first supporting plate.

11. The inserting device of claim 10, wherein the clamping jaw comprises two clamping bodies facing each other, each clamping body comprises a first clamping portion protruded on one end thereof away from the other clamping body and a second clamping portion protruded on a middle thereof, the first clamp groove is formed between the two first clamping portions and the two second clamping portions, and the parallel gripper cylinder is configured to drive the two clamping bodies to move towards and away from each other.

12. The inserting device of claim 1, wherein the positioning assembly comprises a supporting portion, the supporting portion comprises a third supporting plate and a plurality of supporting posts, the third supporting plate is fixed to the first supporting plate via the plurality of supporting posts, the positioning assembly further comprises a first clamper and a second clamper defined on the third supporting plate, the second clamp groove is formed between the first clamper and the second clamper.

13. The inserting device of claim 12, wherein the positioning assembly further comprises a short edge clamp cylinder, the short edge clamp cylinder is coupled to the first clamper, the positioning assembly further comprises a long edge clamp cylinder, the long edge clamp cylinder is coupled to the second clamper, the short edge clamp cylinder and the long edge clamp cylinder are configured to cooperatively limit a size of the second clamp groove.

14. The inserting device of claim 12, wherein the first clamper defines an opening facing the third supporting plate, the inserting device further comprises an orientation detecting mechanism, the orientation detecting mechanism comprises at least one pair of optical sensors, the at least one pair of optical sensors are positioned in the opening and the third supporting plate close to the second clamper respectively, the at least one pair of optical sensors are configured to determine the orientation of the workpiece based on whether the workpiece physically obstructs the optical signal transmitted between the optical sensors.

15. The inserting device of claim 1, wherein the inserting device further comprises a visual system and a control system, the visual system comprises a camera unit, the camera unit is configured to take pictures of the product, and further configured to determine a kind of the product according to the picture, the control system is configured to obtain point site data corresponding to the kind of the product, to control the camera unit to catch pictures of actual positions of two certain points of the product, to calculate a coordinate system of the product according to the actual positions of the two certain points, and to calculate coordinates for inserting the workpiece.

16. The inserting device of claim 15, wherein the assembling mechanism comprises a multi-axial robot, the manipulator and the visual system are positioned on the multi-axial robot, the multi-axial robot is configured to drive the manipulator to clamp the workpiece from the second clamp groove and further configured to insert the workpiece into the product according to the coordinates.

17. The inserting device of claim 1, wherein the manipulator comprises a parallel gripper cylinder, the parallel gripper cylinder is positioned on one end of the multi-axial robot, the parallel gripper cylinder comprises two L-shaped clamping jaws facing each other, the parallel gripper cylinder is configured to drive the two L-shaped clamping jaws to move towards and away from each other, the manipulator further comprises two clamping members, each clamping member comprises a stepped connecting portion and a clamping portion coupled to the stepped connecting portion, each stepped connecting portion couples with one of the two L-shaped clamping jaws, the two clamping portions cooperatively form a clamp groove for clamping the workpiece.

18. The inserting device of claim 17, wherein the manipulator comprises a buffering assembly, the buffering assembly comprises a base, at least one buffering device, and a bottom plate, the at least one buffering device is located between the base and the bottom plate, the bottom plate is pivoted between the two stepped connecting portions.

19. The inserting device of claim 18, wherein the buffering assembly further comprises at least one supporting rod, the at least one supporting rod couples the base with the bottom plate, a buffering device wraps over one of the at least one supporting rod, such that the buffering device is guided by the supporting rod.

20. The inserting device of claim 1, further comprising an orientation detecting mechanism disposed on the positioning mechanism and configured to determine an orientation of the workpiece in the second clamp groove based on optical signal.

* * * * *